United States Patent
Hsu et al.

(12)

(10) Patent No.: US 7,705,666 B1
(45) Date of Patent: Apr. 27, 2010

(54) FILLER CIRCUIT CELL

(75) Inventors: Chen-Hsien Hsu, Hsinchu County (TW); Chien-Kuo Wang, Taoyuan County (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 12/365,874

(22) Filed: Feb. 4, 2009

(51) Int. Cl.
*H03K 5/00* (2006.01)

(52) U.S. Cl. ...................................... 327/552; 327/551

(58) Field of Classification Search .................. 327/94, 327/337, 551–559; 330/9
See application file for complete search history.

(56) References Cited

U.S. PATENT DOCUMENTS 5,805,016 A * 9/1998 Jiang ........................... 327/565
6,388,511 B1 * 5/2002 Kanao ......................... 327/558

\* cited by examiner

*Primary Examiner*—Dinh T. Le
(74) *Attorney, Agent, or Firm*—Winston Hsu

(57) ABSTRACT

A filler circuit cell is disclosed. The filler circuit cell includes a decoupled capacitor, a tie low circuit and a tie high circuit. The decoupled capacitor includes a first NMOS transistor and a first PMOS transistor, in which the source/drain of the first NMOS transistor is connected to a second voltage source and the source/drain of the first PMOS transistor is connected to a first voltage source. The tie low circuit includes a second NMOS transistor and a second PMOS transistor and the tie high circuit includes a third NMOS transistor and a third PMOS transistor.

20 Claims, 3 Drawing Sheets

FILLER CIRCUIT CELL

BACKGROUND OF THE INVENTION

1. Field of the Invention

The invention relates to a filler circuit cell, and more particularly, to a filler circuit cell having a tie low circuit and a tie high circuit.

2. Description of the Prior Art

In current digital integrated circuit design, standard cell libraries are commonly used for achieving high automation in a layout design. As standard cell libraries often contain various kinds of commonly used cell types, such as basic logic gate circuits including AND, OR, NOT, layout engineers are able to take the advantage of these pre-existing cell types from the standard cell library and complete a layout design rapidly.

In order to suit the demand of the fabrication, every cell unit after being processed through a series of automotive tools is substantially rectangular, such that input/output (I/O) could be arranged on the periphery of the cell unit. In most cases, numerous gaps are found in each cell unit as a perfect rectangle is impossible to achieve. Filler circuit cells are utilized in this regard to fill the gaps within a cell unit thereby completing design request such as design rule check. Filler circuit cells are typically divided into two categories, including pattern type filler circuit cells and capacitor type filler circuit cell. Pattern type filler circuit cells do not include any real circuits therein, and are only utilized to fill the gaps within a cell unit. Capacitor type filler circuit cells on the other hand are utilized to provide stable voltage for the circuit such that the circuit between the I/O end and the cell unit is not affected by switching surge resulted from the voltage source.

Referring to FIG. 1, FIG. 1 illustrates a circuit diagram of utilizing MOS transistors to implement a capacitor type filler circuit cell according to the prior art. As shown in FIG. 1, the conventional filler circuit design includes a NMOS transistor 12, a PMOS transistor 14, and two voltage sources (Vdd/Vss) connected to the NMOS transistor 12 and the PMOS transistor 14 respectively. The NMOS transistor 12 includes a gate 16, a source 18, and a drain 18, in which the gate 16 is directly connected to the voltage source Vdd whereas the source 18 and the drain 18 is connected to the voltage source Vss. PMOS transistor 14 includes a gate 20, a source 22 and a drain 22, in which the gate 20 is directly connected to the voltage source Vss and the source 22 and the drain 22 is connected to the voltage source Vdd.

Despite the aforementioned filler circuit cell may be used to fill gaps within a cell unit, the conventional design of connecting the gate 16 of the NMOS transistor 12 and the gate 20 of the PMOS transistor 14 to the voltage source typically causes severe damage to the gate dielectric layer/inversion layer of the transistor as a sudden glitch is generated at either one of the voltage source. This results in breakdown of the entire transistor.

SUMMARY OF THE INVENTION

It is an objective of the present invention to provide a filler circuit design to improve the aforementioned problems.

A filler circuit cell is disclosed. The filler circuit cell includes a decoupled capacitor comprising a first n-type metal-oxide semiconductor (NMOS) transistor and a first p-type metal-oxide semiconductor (PMOS) transistor, wherein the source/drain of the first NMOS transistor is connected to a second voltage source and the source/drain of the first PMOS transistor is connected to a first voltage source; a tie low circuit disposed between the first PMOS transistor and the second voltage source, wherein the tie low circuit comprises a second NMOS transistor and a second PMOS transistor; and a tie high circuit disposed between the first NMOS transistor and the first voltage source, wherein the tie high circuit comprises a third NMOS transistor and a third PMOS transistor.

According to another aspect of the present invention, a filler circuit cell is disclosed. The filler circuit cell includes a decoupled capacitor comprising a first MOS transistor, wherein the source/drain of the first MOS transistor is connected to a first voltage source; and a voltage stabilizing unit disposed between the first MOS transistor and the first voltage source, wherein the voltage stabilizing unit comprises a second MOS transistor and a third MOS transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
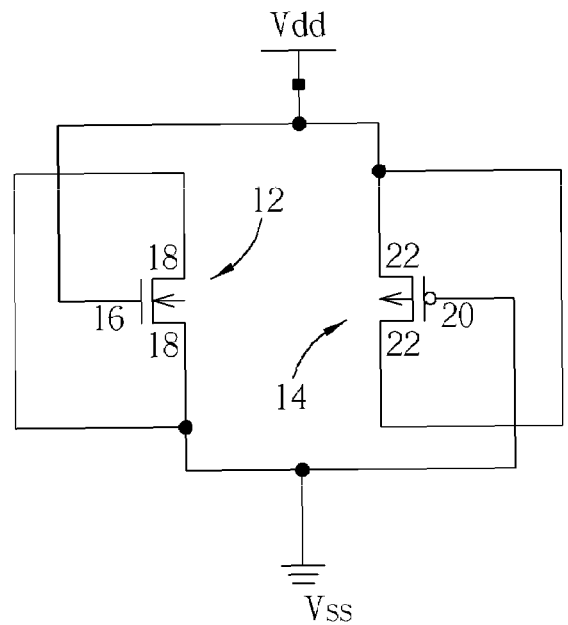
FIG. 1 illustrates a circuit diagram of utilizing MOS transistors to implement a capacitor type filler circuit cell according to the prior art.
Figure 2:
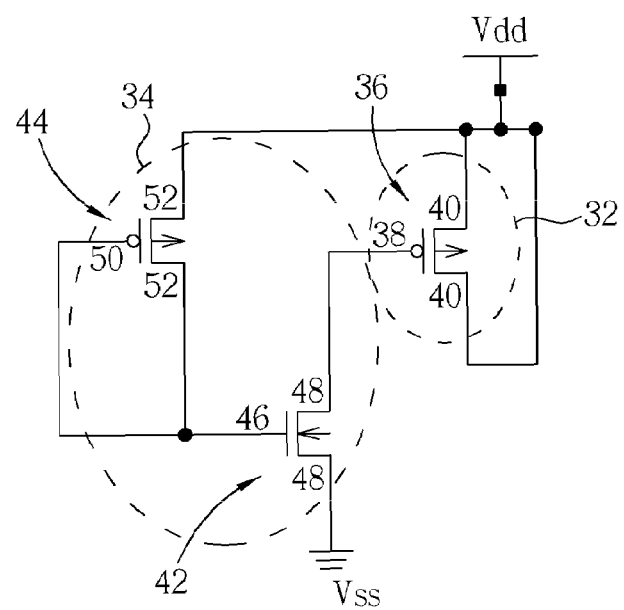
FIG. 2 illustrates circuit diagram of a filler circuit cell according to a preferred embodiment of the present invention.

Referring to FIG. 2, FIG. 2 illustrates circuit diagram of a filler circuit cell according to a preferred embodiment of the present invention. The filler circuit cell preferably includes a decoupled capacitor 32 and a voltage stabilizing unit 34 connected to the decoupled capacitor 32. The decoupled capacitor 32 includes a transistor, such as a PMOS transistor 36. The PMOS transistor 36 includes a gate 38, a source 40 and a drain 40. The voltage stabilizing unit 34 includes a NMOS transistor 42 and a PMOS transistor 44, in which the NMOS transistor 42 includes a gate 46, a source 48 and a drain 48 and the PMOS transistor 44 includes a gate 50, a source 52 and a drain 52.

In this embodiment, one source/drain 52 of the PMOS transistor 44 of the voltage stabilizing unit 34 is directly connected to a voltage source Vdd while the gate 50 and the other source/drain 52 is connected to the gate 46 of the NMOS transistor 42 simultaneously. One source/drain 48 of the NMOS transistor 42 is connected to the gate 38 of the PMOS transistor 36 of the decoupled capacitor 32 while the other source/drain 48 is connected to a voltage source Vss. The two source/drains 40 of the PMOS transistor 36 is connected to the voltage source Vdd simultaneously.

Despite the decoupled capacitor 32 of the aforementioned embodiment is implemented with a PMOS transistor 36, a NMOS transistor could also be used to implement a decoupled capacitor, which is also within the scope of the present invention. For instance, when the decoupled capacitor 32 is composed of a NMOS transistor, the position of the NMOS transistor 42 and the PMOS transistor 44 of the voltage stabilizing unit 34 shown in FIG. 2 could be switched, such that one source/drain 52 of the PMOS transistor 44 is used to control the on-off of the gate 38 of the decoupled capacitor 32 while the other source/drain 52 is connected to the voltage source Vdd. This embodiment is also within the scope of the present invention.

The above design specifically provides a stable voltage source for the filler circuit cell by placing the voltage stabilizing unit 34 between two voltage sources Vss/Vdd and the decoupled capacitor 32, in which one end of the voltage stabilizing unit 34 is directly connected to the voltage source Vdd while the other end is used to control the gate 38 of the PMOS transistor 36. In other words, as the gate 38 of the PMOS transistor 36 is not directly connected to the voltage source Vdd, a buffering effect is obtained from the two transistor of the voltage stabilizing unit 34 and damage to the gate dielectric layer/inversion layer of the PMOS transistor 36 caused by a sudden glitch is effectively prevented.

Figure 3:
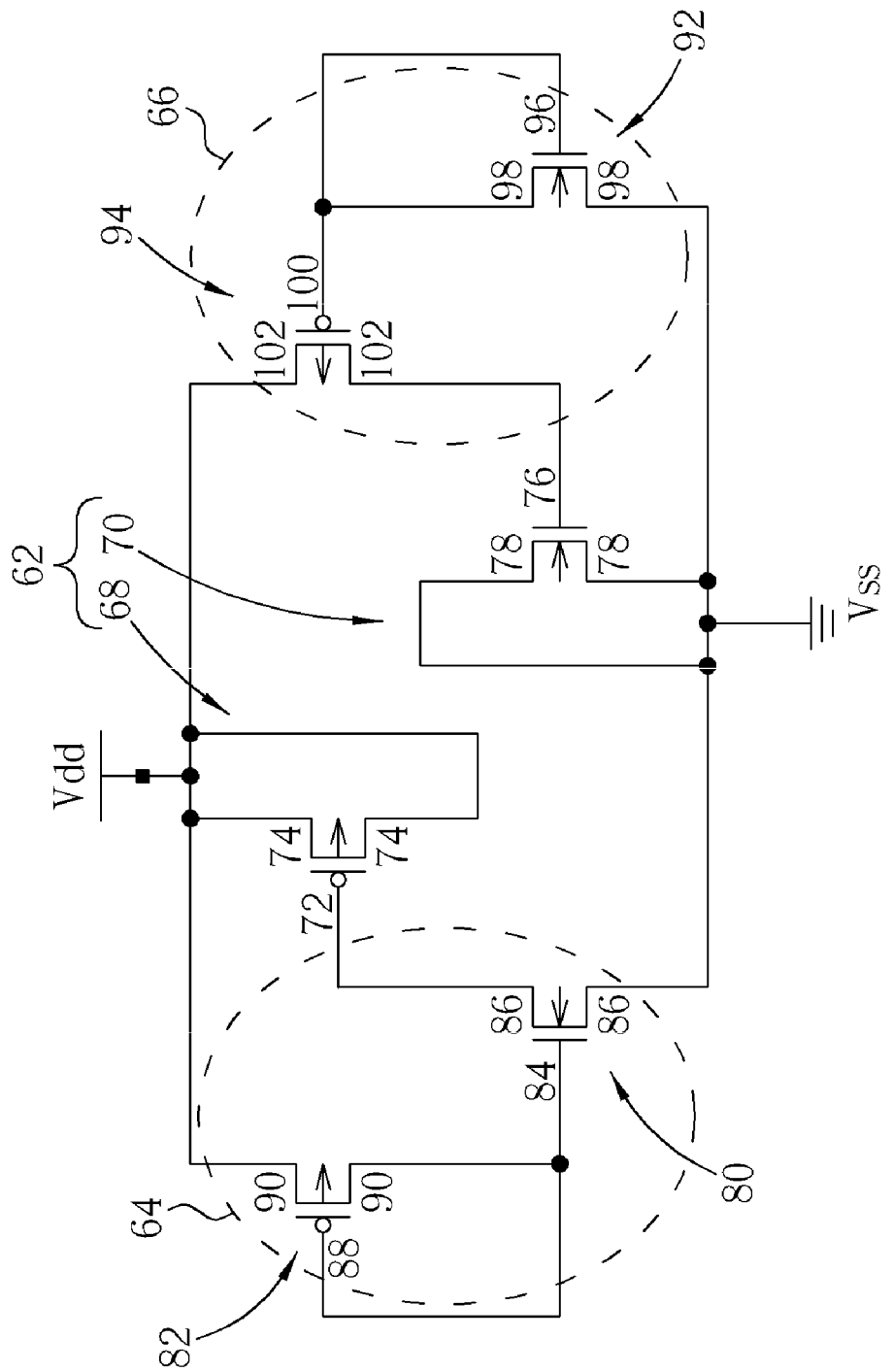
FIG. 3 illustrates a circuit diagram of a filler circuit cell according to an embodiment of the present invention.

Referring to FIG. 3, FIG. 3 illustrates a circuit diagram of a filler circuit cell according to an embodiment of the present invention. As shown in FIG. 3, the filler circuit cell includes a decoupled capacitor 62, a voltage source Vss and a voltage source Vdd, and a tie low circuit 62 and a tie high circuit 66 placed between the two voltage sources and the decoupled capacitor 62. The decoupled capacitor 62 includes a PMOS transistor 68 and a NMOS transistor 70, in which the PMOS transistor 68 includes a gate 72, a source 74 and a drain 74 and the NMOS transistor 70 includes a gate 76, a source 78 and a drain 78.

The tie low circuit 64 includes a NMOS transistor 80 and a PMOS transistor 82. The NMOS transistor 80 includes a gate 84, a source 86 and a drain 86 and the PMOS transistor 82 includes a gate 88, a source 90 and a drain 90. In this embodiment, one source/drain 90 of the PMOS transistor 82 of the tie low circuit 64 is electrically connected to the voltage source Vdd while the gate 88 and the other source/drain 90 is connected to the gate 84 of the NMOS transistor 80 simultaneously for controlling the on-off of the NMOS transistor 80. One source/drain 86 of the NMOS transistor 80 is directly connected to the gate 72 of the PMOS transistor 68 of the decoupled capacitor 62 such that the PMOS transistor 68 is always turned on. The other source/drain 86 of the NMOS transistor 80 is connected to the voltage source Vss. Overall, by placing the tie low circuit 64 between two voltage sources Vdd/Vss and the PMOS transistor 68 of the decoupled capacitor 62, the tie low circuit 64 is preferably utilized as a buffering circuit to maintain the gate 72 of the PMOS transistor 68 at a low potential level and prevent the PMOS transistor 68 from damage caused by sudden glitch.

The tie high circuit 66 includes a NMOS transistor 92 and a PMOS transistor 94, in which the NMOS transistor 92 includes a gate 96, a source 98 and a drain 98 and the PMOS transistor 94 includes a gate 100, a source 102 and a drain 102. Similar to the connection of tie low circuit 64, one source/drain 98 of the NMOS transistor 92 of the tie high circuit 66 is directly connected to the voltage source Vss while the gate 96 and the other source/drain 98 is connected to the gate 100 of the PMOS transistor 94 simultaneously to control the on-off of PMOS transistor 94. One source/drain 102 of the PMOS transistor 94 is directly connected to the gate 76 of the NMOS transistor 70 of the decoupled capacitor 62 such that the NMOS transistor 70 is always turned on. The other source/drain 102 of the PMOS transistor 94 is connected to another voltage source Vdd. Overall, by placing the tie high circuit 66 between two voltage sources Vdd/Vss and the NMOS transistor 70 of the decoupled capacitor 62, the tie high circuit 66 is utilized as a buffering circuit to maintain the gate 76 of the NMOS transistor 70 at a high potential while preventing the NMOS transistor 70 from damage caused by sudden glitch.

Figure 4:
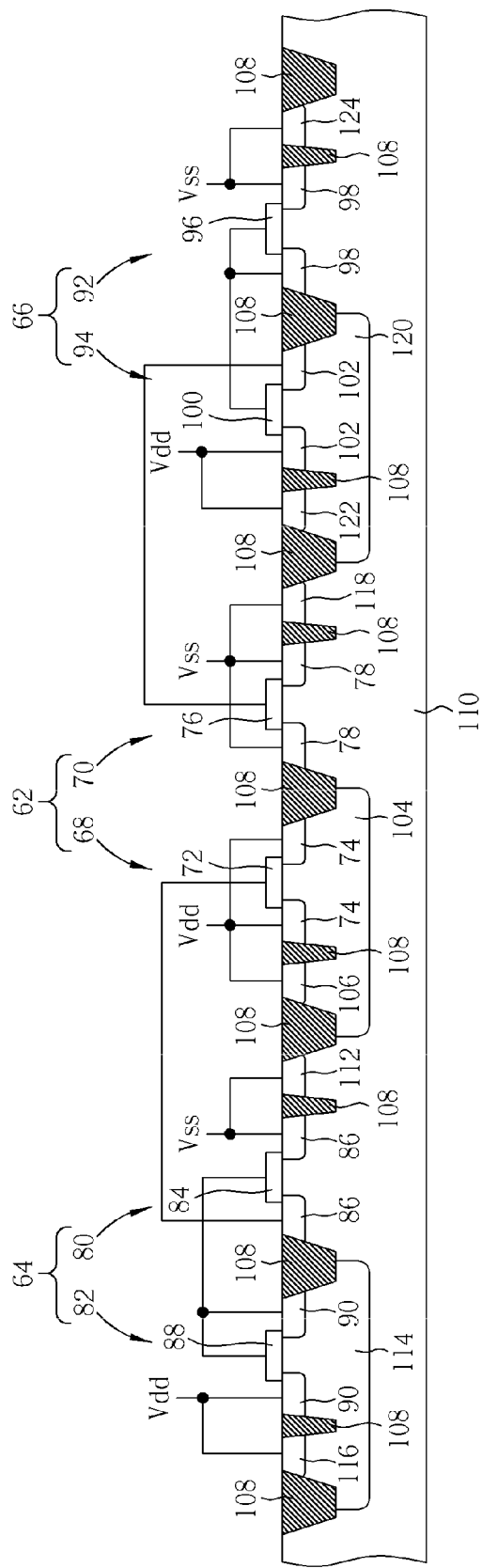
FIG. 4 illustrates a structural diagram of the filler circuit cell shown in FIG. 3.

Referring to FIG. 4, FIG. 4 illustrates a structural diagram of the filler circuit cell shown in FIG. 3. As shown in FIG. 4, the filler circuit cell includes a group of decoupled capacitors 62, a tie low circuit 64 connected to the PMOS transistor 68 of the decoupled capacitor 62 and a tie high circuit 66 connected to the NMOS transistor 70 of the decoupled capacitor 62. The decoupled capacitor 62 comprising the PMOS transistor 68 is disposed in a n-well 104 and composed of a gate 72, a source 74 and a drain 74 disposed in the n-well 104 at two sides of the gate 72, a N+ doping region 106 adjacent to the source/drain 74 for serving as electrical connecting end of the n-well 104 and a plurality of shallow trench isolations 108 separating the N+ doping region 106 (such as the n-well 104), the PMOS transistor 68 and adjacent transistors. The source 74 and the drain 74 of the PMOS transistor 68 and the N+ doping region are connected to the voltage source Vdd simultaneously.

The tie low circuit 64 includes a NMOS transistor 80 and a PMOS transistor 82. The NMOS transistor 80 is disposed in a p-type substrate 110, which further includes a gate 84, a source 86 and a drain 86 formed in the p-type substrate 110 with respect to two sides of the gate 84. A P+ doping region 112 is formed in the p-type substrate 110 adjacent to the source/drain 86 for serving as electrical connecting end of the p-type substrate 110 and a plurality of shallow trench isolations 108 are formed to separate the P+ doping regions 112, the NMOS transistor 80 and other adjacent transistors and doping regions. One source/drain 86 of the NMOS transistor 80 and the P+ doping region 112 are connected to a voltage source Vss simultaneously while the other source/drain 86 is connected to the gate 72 of the PMOS transistor 68.

The PMOS transistor 82 of the tie low circuit 64 is disposed in a n-well 114, which includes a gate 88, a source 90 and a drain 90 formed in the n-well 114 adjacent to two sides of the gate 88. A N+ doping region 116 is formed in the n-well 114 adjacent to the source/drain 90 for serving as electrical connecting end of the n-well 114 and a plurality of shallow trench isolations 108 are formed to separate the N+ doping region 116, the PMOS transistor 82 and other adjacent transistor and doping regions. One source/drain 90 of the PMOS transistor 82 and the N+ doping region 116 (such as the n-well 114) are connected to the voltage source Vdd simultaneously while the gate 88 and other source/drain 90 are connected to the gate 84 of the NMOS transistor 80.

The decoupled capacitor 62 comprising the NMOS transistor 70 is disposed in a p-type substrate 110 and composed of a gate 76, a source 78 and a drain 78 formed in the p-type substrate 110 adjacent to two sides of the gate 76, a P+ doping region 118 adjacent to the source/drain 78 for serving as electrical connecting end of the p-type substrate 110 and a plurality of shallow trench isolations 108 separating the P+ doping region 118, the NMOS transistor 70, and adjacent transistors and doping regions. The source/drain 78 of the NMOS transistor 70 and the P+ doping region 118 (such as p-type substrate 110) are connected to a voltage source Vss simultaneously.

The tie high circuit 66 includes a NMOS transistor 92 and a PMOS transistor 94. The PMOS transistor 94 is disposed in a n-well 120, which further includes a gate 100, a source 102 and a drain 102 formed in the n-well 120 adjacent to two sides of the gate 100. A N+ doping region 122 is formed in the n-well 120 adjacent to the source/drain 102 for serving as electrical connecting end of the n-well 120 and a plurality of shallow trench isolations 108 is formed to separate the N+ doping region 122, the PMOS transistor 94 and the adjacent transistors and doping regions. One source/drain 102 of the PMOS transistor 94 and the N+ doping region 122 (such as the n-well 120) are directly connected to the voltage source Vdd while the other source/drain is connected to the gate 76 of the NMOS transistor 70.

The NMOS transistor 92 of the tie high circuit 66 is disposed in a p-type substrate 110, which includes a gate 96, a source 98 and a drain 98 formed in the p-type substrate 110 adjacent to two sides of the gate 96. A P+ doping region 124 is formed in the p-type substrate 110 adjacent to the source/drain 98 for serving as electrical connecting end of the p-type substrate 110 and a plurality of shallow trench isolations 108 is formed to separate the P+ doping region 124, the NMOS transistor 92 and other adjacent transistors. One source/drain 98 of the NMOS transistor 92 and the P+ doping region 124 (such as the p-type substrate 110) is directly connected to the voltage source Vss while the gate 96 and the other source/drain 98 are connected to the gate 100 of the PMOS transistor 94.

Those skilled in the art will readily observe that numerous modifications and alterations of the device and method may be made while retaining the teachings of the invention.

What is claimed is:

1. A filler circuit cell, comprising:
   a decoupled capacitor comprising a first n-type metal-oxide semiconductor (NMOS) transistor and a first p-type metal-oxide semiconductor (PMOS) transistor, wherein the source and drain of the first NMOS transistor is connected to a second voltage source and the source and drain of the first PMOS transistor is connected to a first voltage source;
   a tie low circuit disposed between the first voltage source, a gate of the first PMOS transistor and the second voltage source, wherein the tie low circuit comprises a second NMOS transistor and a second PMOS transistor; and
   a tie high circuit disposed between the first voltage source, a gate of the first NMOS transistor and the second voltage source, wherein the tie high circuit comprises a third NMOS transistor and a third PMOS transistor.

2. The filler circuit cell of claim 1, wherein one source/drain of the second NMOS transistor is connected to the gate of the first PMOS transistor.

3. The filler circuit cell of claim 2, wherein the other source and drain of the second NMOS transistor is connected to the second voltage source.

4. The filler circuit cell of claim 1, wherein one source and drain and gate of the second PMOS transistor is connected to the gate of the second NMOS transistor.

5. The filler circuit cell of claim 4, wherein the other source and drain of the second PMOS transistor is connected to the first voltage source.

6. The filler circuit cell of claim 1, wherein one source and drain and gate of the third NMOS transistor is connected to the gate of the third PMOS transistor.

7. The filler circuit cell of claim 6, wherein the other source and drain of the third NMOS transistor is connected to the second voltage source.

8. The filler circuit cell of claim 1, wherein one source and drain of the third PMOS transistor is connected to the gate of the first NMOS transistor.

9. The filler circuit cell of claim 8, wherein the other source and drain of the third PMOS transistor is connected to the first voltage source.

10. The filler circuit cell of claim 1, wherein the first voltage source is a Vdd voltage source.

11. The filler circuit cell of claim 1, wherein the second voltage source is a Vss voltage source.

12. A filler circuit cell, comprising:
    a decoupled capacitor comprising a first MOS transistor, wherein the source and drain of the first MOS transistor is connected to a first voltage source; and
    a voltage stabilizing unit disposed between the first voltage source, a gate of the first MOS transistor and a second voltage source to prevent damage for the gate of the first MOS transistor caused by sudden glitches, wherein the voltage stabilizing unit comprises a second MOS transistor and a third MOS transistor.

13. The filler circuit cell of claim 12, wherein one source and drain of the second MOS transistor is connected to the gate of the first MOS transistor.

14. The filler circuit cell of claim 13, wherein another source and drain of the second MOS transistor is connected to the second voltage source.

15. The filler circuit cell of claim 12, wherein one source and drain of the third MOS transistor is connected to the first voltage source.

16. The filler circuit cell of claim 15, wherein another source and drain and gate of the third MOS transistor is connected to the gate of the second MOS transistor.

17. The filler circuit cell of claim 12, wherein the first voltage source is a Vdd voltage source.

18. The filler circuit cell of claim 14, wherein the second voltage source is a Vss voltage source.

19. The filler circuit cell of claim 12, wherein the first voltage source is a Vss voltage source.

20. The filler circuit cell of claim 14, wherein the second voltage source is a Vdd voltage source.

* * * * *